(12) United States Patent
Ouellette et al.

(10) Patent No.: US 8,537,627 B2
(45) Date of Patent: Sep. 17, 2013

(54) DETERMINING FUSEBAY STORAGE ELEMENT USAGE

(75) Inventors: Michael R. Ouellette, Wesford, VT (US); Michael A. Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 13/223,949

(22) Filed: Sep. 1, 2011

(65) Prior Publication Data

US 2013/0058176 A1 Mar. 7, 2013

(51) Int. Cl.
*G11C 7/00* (2006.01)

(52) U.S. Cl.
USPC ........................................ 365/200; 365/225.7

(58) Field of Classification Search
USPC .............................. 365/200, 225.7, 238.5, 240
See application file for complete search history.

(56) References Cited

U.S. PATENT DOCUMENTS

| | | | |
|---|---|---|---|
| 5,111,457 A | 5/1992 | Rabjohns et al. |
| 5,134,616 A | 7/1992 | Barth et al. |
| 5,610,534 A | 3/1997 | Galbraith et al. |
| 5,732,202 A | 3/1998 | Okamoto |
| 6,038,179 A | 3/2000 | Eustis et al. |
| 6,333,878 B2 | 12/2001 | Ooishi |
| 6,367,042 B1 | 4/2002 | Phan et al. |
| 6,434,066 B1 | 8/2002 | Waller et al. |
| 6,577,156 B2 | 6/2003 | Anand et al. |
| 6,651,202 B1 | 11/2003 | Phan |
| 6,757,204 B2 | 6/2004 | Di Ronza et al. |
| 6,766,468 B2 | 7/2004 | Barth, Jr. et al. |
| 6,768,694 B2 | 7/2004 | Anand et al. |
| 6,856,569 B2 | 2/2005 | Nelson et al. |
| 6,898,143 B2 | 5/2005 | Puri et al. |
| 6,922,649 B2 | 7/2005 | Mondal et al. |
| 6,961,890 B2 | 11/2005 | Smith |
| 7,035,158 B2 | 4/2006 | Kozuka |
| 7,043,672 B2 | 5/2006 | Merritt |
| 7,085,182 B2 | 8/2006 | Collura et al. |
| 7,089,136 B2 | 8/2006 | Anand et al. |
| 7,093,171 B2 | 8/2006 | Hsu et al. |
| 7,162,669 B2 | 1/2007 | Gross |
| 7,174,486 B2 | 2/2007 | Adams et al. |
| 7,218,561 B2 | 5/2007 | Cowles et al. |
| 7,237,154 B1 | 6/2007 | Zorian |
| 7,251,756 B2 | 7/2007 | Anand et al. |

(Continued)

OTHER PUBLICATIONS

Agarwal et al., "An Approximation to the Greedy Algorithm for Differential Compression", Jan. 2006, pp. 149-166, IBM J. Res. & Dev., vol. 50, No. 1.

(Continued)

*Primary Examiner* — Son Dinh
(74) *Attorney, Agent, or Firm* — David A. Cain; Hoffman Warnick LLC

(57) ABSTRACT

Used fusebay storage elements are counted so that storage of data may begin at a first unused storage element. Repair register length and a number of previous passes are stored in a fuse header of a fusebay. When a bit of data is sent to the repair register, a repair register position tracker value is changed by one until it reaches a first value. When the first value is reached, a pass tracker value is changed by one. If the first value is not reached, the steps are repeated. A bit counter and/or a page counter may be included.

20 Claims, 10 Drawing Sheets

(56) References Cited

U.S. PATENT DOCUMENTS

| | | | |
|---|---|---|---|
| 7,269,765 B1 | 9/2007 | Charlton et al. | |
| 7,286,419 B2 | 10/2007 | Doi | |
| 7,289,382 B2 | 10/2007 | Mozdzen | |
| 7,359,243 B2 | 4/2008 | Ha | |
| 7,359,261 B1 | 4/2008 | Wu et al. | |
| 7,373,573 B2 | 5/2008 | Riley | |
| 7,379,357 B2 | 5/2008 | Kang | |
| 7,406,620 B2 | 7/2008 | Shubat et al. | |
| 7,407,113 B2 | 8/2008 | Guterman | |
| 7,415,640 B1 | 8/2008 | Zorian et al. | |
| 7,432,755 B1 | 10/2008 | Park et al. | |
| 7,477,565 B2 | 1/2009 | Nam et al. | |
| 7,490,276 B1 * | 2/2009 | White et al. | 714/718 |
| 7,493,541 B1 | 2/2009 | Agrawal et al. | |
| 7,512,838 B2 | 3/2009 | Rector et al. | |
| 7,518,899 B2 | 4/2009 | Perry et al. | |
| 7,538,410 B2 | 5/2009 | Yang | |
| 7,551,470 B2 | 6/2009 | Erickson et al. | |
| 7,627,792 B2 | 12/2009 | Di Ronza et al. | |
| 7,698,608 B2 | 4/2010 | Riley | |
| 7,704,805 B1 | 4/2010 | Cheng et al. | |
| 7,757,135 B2 | 7/2010 | Nadeau-Dostie et al. | |
| 7,774,660 B2 | 8/2010 | Hsu et al. | |
| 7,791,972 B2 | 9/2010 | Ouelette et al. | |
| 7,818,490 B2 | 10/2010 | Conley | |
| 7,839,707 B2 | 11/2010 | Aakjer | |
| 7,895,028 B2 | 2/2011 | Anand et al. | |
| 2008/0266956 A1 | 10/2008 | Byeon et al. | |
| 2009/0016129 A1 | 1/2009 | Anand et al. | |
| 2009/0190422 A1 | 7/2009 | Khoja et al. | |
| 2009/0285024 A1 | 11/2009 | Kang | |
| 2010/0284222 A1 | 11/2010 | Jang | |
| 2012/0155184 A1 | 6/2012 | Kang | |

OTHER PUBLICATIONS

Tran, Notice of Allowance and Fee(s) Due for U.S. Appl. No. 13/198,894 dated Feb. 12, 2013, 14 pages.

Alphonse, Notice of Allowance and Fee(s) Due for U.S. Appl. No. 13/204,929 dated Mar. 1, 2013, 15 pages.

* cited by examiner

DETERMINING FUSEBAY STORAGE ELEMENT USAGE

BACKGROUND

The present invention relates to semiconductor devices and, more specifically, to control devices enabling storage of data in a fusebay arrangement.

In semiconductor chip manufacture, self-testing and -repair systems are often included in a chip design. Such systems typically include a storage device, such as a fusebay, in which repair data may be stored and retrieved by a fusebay controller. The fusebay controller generally processes the repair data during storage and during retrieval, such as by applying compression during storage and decompression during retrieval.

An example of such a system 100 is illustrated in FIG. 1. Repair data for a chip is stored in a fusebay bank 110, typically including primary, secondary, and tertiary fusebays 112, 114, 116, in which arrays of one-time-programmable (OTP) elements or fuses are used to represent the data. A "blown" fuse represents a one, while an intact fuse represents a zero. The repair data in the fusebay bank 110 is typically compressed. Upon startup or power-up of the chip, a repair device 120 loads repair data from the fusebays 112, 114, 116 into corresponding decompressors 122, 124, 126. Data from primary and secondary decompressors 122, 124 is sent to XOR comparator 130, the output of which is sent to XOR comparator 132 for comparison to data from tertiary 126 decompressor. The output of XOR comparator 132 is sent to a repair register 140.

The approach shown in FIG. 1 yields fusebays each dedicated to a single pass of data. In other words, during programming or storage, primary fusebay 112 receives a first pass of data, another fusebay receives the second, and so on. In addition, the sizes of the fusebays are fixed upon construction, so that if a repair pass yields more repair data to store than the number of fuses allocated in its respective fusebay, then there is not enough room for the entire repair pass. These issues arise at least in part because of the manner in which data is stored: a current pass of repair data is simply sent to its respective fusebay, the necessary fuses are blown, and that fusebay becomes a read-only device, containing only the repair data related to the current repair pass.

SUMMARY

According to an embodiment of the invention disclosed herein, a fusebay storage element usage determining structure may be implemented in a fusebay controller structure configured to retrieve data from and to send data to a fusebay, as well as to retrieve data from and to send data to a repair register. The fusebay storage element usage determining structure may include a repair position tracker configured to receive a first initial value, and to change in value by one in response to a bit of repair data being sent to the repair register. A pass tracker may be configured to receive a second initial value, and to change in value by one in response to a repair pass of data being completed. In addition, a page end indicator configured to receive a third initial value may be included. The page end indicator may track a page location, and may be configured to indicate when an end of a page has been reached.

An embodiment of the invention disclosed herein may be implemented as a fusebay storage element usage determining system having a fusebay and a fusebay controller. The fusebay may include a fuse header with a repair register length storage portion and a pass count storage portion. The fusebay controller may be configured to communicate with a repair register and with the fusebay. A repair position tracker may be configured to receive a first initial value, and to change in value by one in response to a bit of repair data being sent to the repair register. In addition, a pass tracker may be included and configured to receive a second initial value, and to change in value by one in response to a repair pass being complete. A page end indicator may also be provided and configured to receive a third initial value, to track a page location, and to indicate when an end of a page has been reached.

Further, a fusebay storage element usage determining method according to an embodiment of the invention disclosed herein may be executed by a fusebay storage element usage determining structure. The structure may be configured to communicate with a fusebay and may include a repair register position tracker, a pass tracker, a page position tracker, and a page end indicator. A first initial value of the repair position tracker may be set, as may a second initial value of the pass tracker and a third initial value of the page position tracker. A bit of data may be retrieved from the fusebay, and the value of the page position tracker may be changed by one. A bit of repair data may be sent to the repair register, and the value of the repair register position tracker may be changed by one. It may be determined whether the retrieved bit is a last bit stored in the fusebay, and, using at least a value of the repair register position tracker, whether a repair pass of data has been completed. If a repair pass of data has been completed, then the value of the pass tracker may be changed by one, and it may be determined, using at least a value of the pass tracker, whether all stored repair passes of data have been retrieved. If all stored repair passes of data have been retrieved and the retrieved bit is the last bit of data stored in the fusebay, a position of the last bit retrieved may be reported. If all repair passes have not been retrieved and the retrieved bit of data is not the last bit of data stored in the fusebay, the repair position tracker may be reset to the first initial value, another bit of data may be retrieved from the fusebay, the page position tracker value may be changed by one, the bit of repair data may be sent to the repair register, the repair register position tracker value may be changed by one, and it may again be determined whether a repair pass of data has been completed. If a repair pass has not been completed and the retrieved bit of data is not the last bit of data, another bit of data may be retrieved from the fusebay, the page position tracker value may be changed by one, the bit of repair data may be sent to the repair register, the repair position tracker value may be changed by one, and it may again be determined whether a repair pass of data has been completed. If the retrieved bit of data is the last bit of data stored in the fusebay, retrieval of data from the fusebay may be ended and a location of the last bit of data may be reported.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Embodiments of the invention disclosed herein provide a fusebay controller system that may offer flexibility at manufacturing test and that may employ various levels of data integrity uplift. Such flexibility and data integrity uplift may advantageously improve fuse programming yield with relatively little impact on test escapes of marginally programmed fuses.

Figure 1:
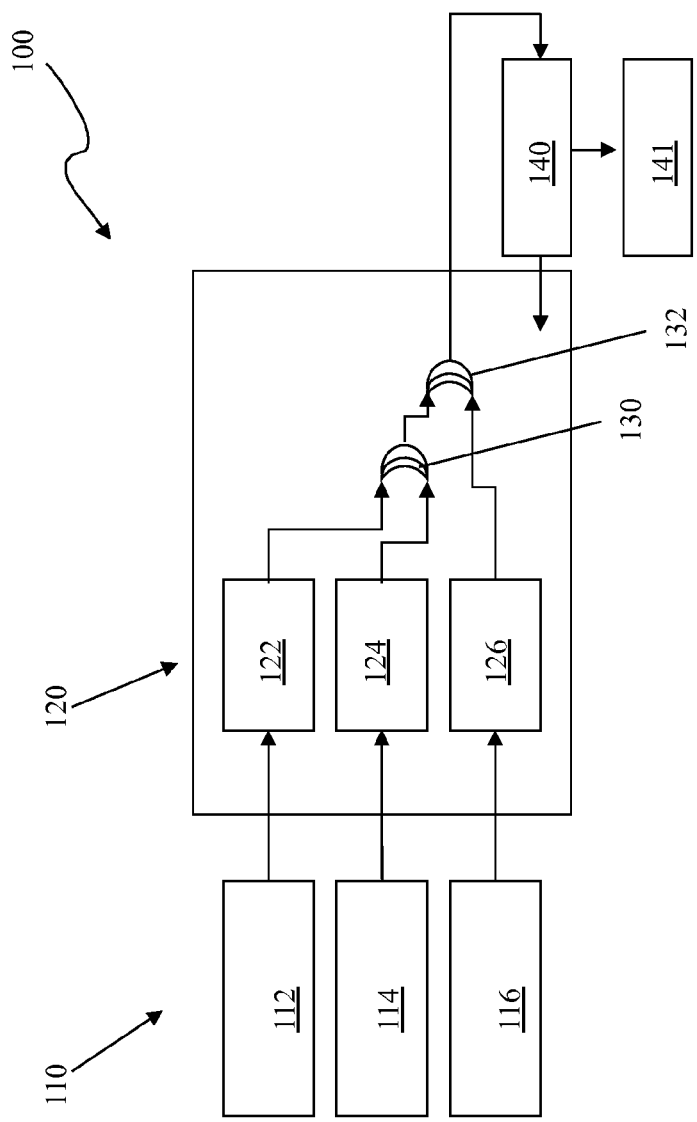
FIG. 1 is a schematic diagram of a prior art multiple fusebay system.
Figure 2:
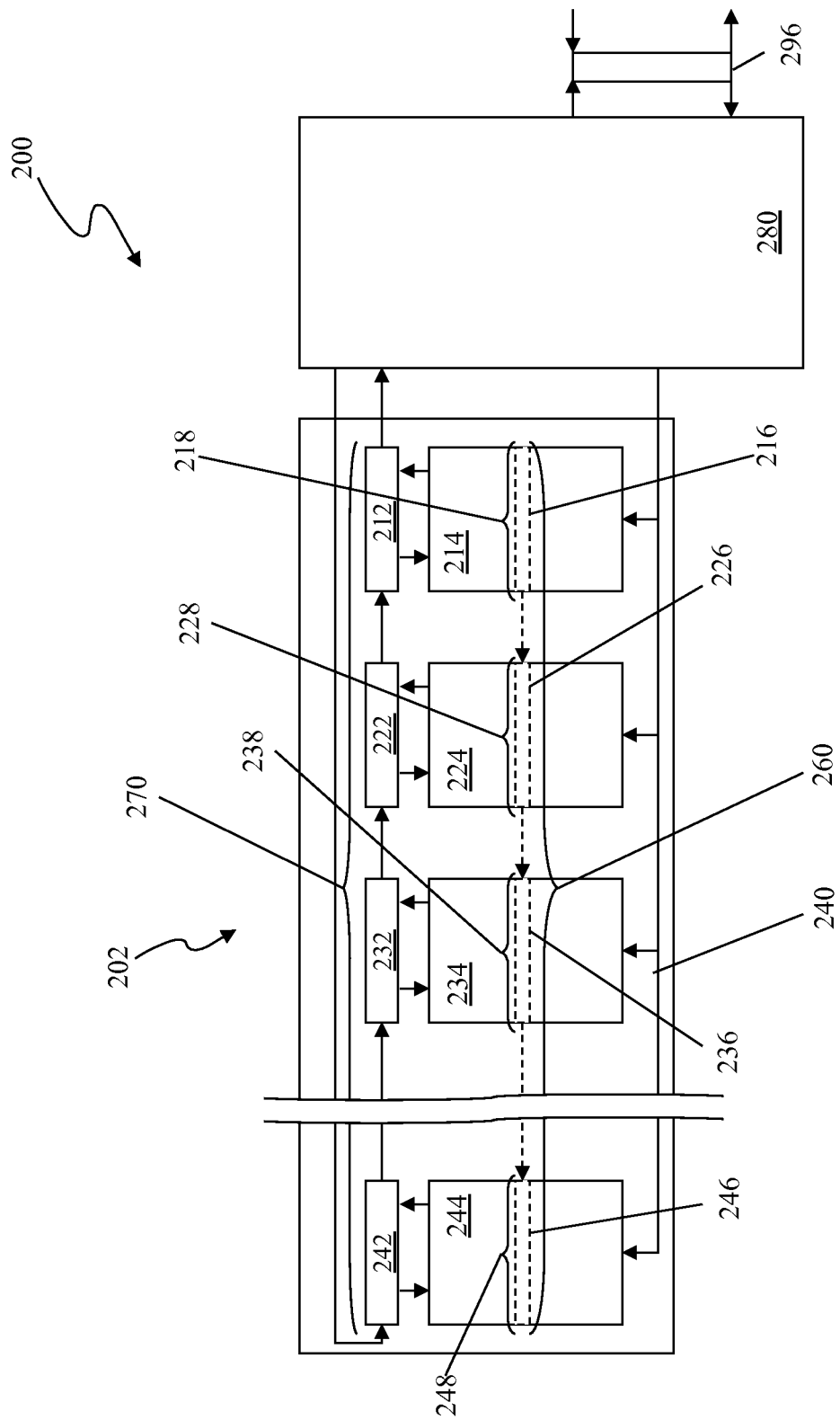
FIG. 2 is a schematic diagram of a variable-page-length fusebay system with which embodiments of the invention disclosed herein may be employed.

In FIG. 2, the prior art multiple fusebay fuse system 100 is replaced with an example of a single fusebay system 200. The single fusebay 200 system may include a single fusebay 202 of modular or variable size construction controlled by a fuse controller 280. For example, fusebay 202 may include multiple fuse blocks 214, 224, 234, 244. As suggested by the gap between fuse blocks 234 and 244, as many fuse blocks may be used as desired and/or required for a given application. For example, the number of fuse blocks used to construct the single fusebay system may depend upon the number of fuses needed to support a given chip design's repairable memory content. Fuse controller 280 may receive from and send data to a repair register 296. In addition, fuse controller 280 may send data to and receive data from the fuse blocks using a fusebay register 270, which may comprise fuse block registers 212, 222, 232, 242. Fuse programming to each fuse block may be controlled by shared fuse controller 280 so that the fusebay may have a page length 260 that may be the sum or concatenation of a fuse word or fuseblock page lengths 218, 228, 238, 248 from each fuse block. For example, each fuse block may include the same number of fuse words or fuse block pages so that each fuse block may have a fuseblock page or fuse word at a shared page address. A fuse word from each fuse block 216, 226, 236, 246, each corresponding to the same page address, may thus be treated as a single fusebay page 260. The length of a fusebay page 260 may vary from one chip design to the next, depending upon the number and page lengths of fuse blocks present in the design.

Figure 3:
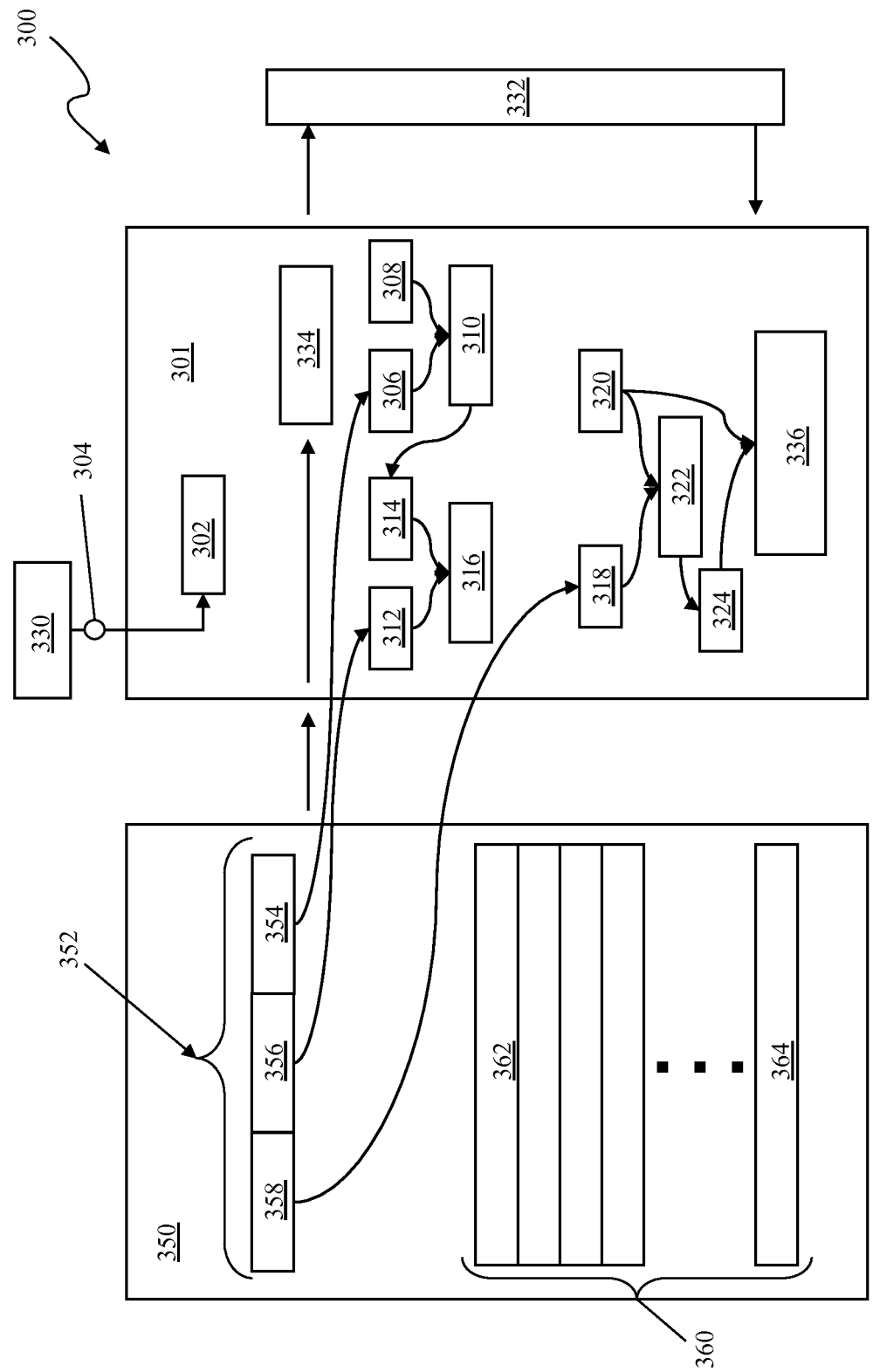
FIG. 3 is a schematic diagram of a fusebay controller including fusebay storage element usage determining components according to an embodiment of the invention disclosed herein.

As seen in FIG. 3, embodiments of the invention disclosed herein may include a fusebay storage usage determining structure 300 that may, for example, be implemented in a fusebay controller structure 301. Structure 300 may include an instruction register 302 configured to receive an instruction signal via an instruction input 304. Examples of instructions that might be received by instruction register 302 include retrieval instructions, decompression instructions, storage instructions, compression instructions, register length calculation instructions, and other instructions as may be appropriate and/or desired. A repair register length register 306 may be configured to receive a value of a length of a repair register 332 to which fusebay controller structure 301 may be configured to be connected. A repair register position tracker 308 may be configured to determine how far into repair register 332 retrieved data has proceeded. Similarly, a repair pass completion detector 310 may be configured to determine when a repair pass of data has been completed, such as by using repair register position and/or repair register length. A repair pass storage register 312 may receive a number of previously stored repair passes Npass, such as might be retrieved from fusebay 350 as will be explained below. A repair pass tracker 314 may be configured to determine how many of a number of previously stored repair passes of data have been retrieved and/or how many passes of new data have been stored, such as by using information from pass completion detector 310. Using the number of previously stored passes Npass and/or information from pass tracker 314, an all passes completed detector may determined when all previously stored repair passes of data have been retrieved.

Embodiments of the invention disclosed herein may also include a page length storage register 318 that may receive a page length Lpg of and/or from fusebay 350 as will be explained below. In addition, a page position tracker 320 may, for example, change in value by one every time a bit is retrieved from fusebay 350 so that a position of a last retrieved bit may be determined and progress through a page of data being retrieved from fusebay 350 may be known. A page completion detector 322 may use page position information from page position tracker 320 and/or page length $L_{pg}$ information from page length storage register 318 to determine when a complete page of data has been retrieved from fusebay 350. In addition, a page counter 324 may keep track of a number of pages of previously stored data that have been retrieved and/or new data that has been stored in fusebay 350. Embodiments may be configured to interact with other logic elements of fusebay controller structure 301, such as decompression logic 334 and compression and/or fuseblow logic 336. During storage of new data, for example, a value of page position tracker 322 and/or of page counter 324 may be supplied to fuseblow logic 336.

In embodiments of the invention disclosed herein, fusebay storage element usage determining structure 300 may be configured to interact with a fusebay 350, such as a fusebay akin to that of fusebay system 200 shown in FIG. 2. In particular, fusebay 350 may include a fuse header 352, which may include a repair register length storage portion 354 from which repair register length storage register 306 may be configured to receive a length of repair register 332. Fuse header 352 may also include a pass count storage portion 356 from which repair pass storage register 312 may be configured to receive a number of previously stored repair passes of data. In addition, fusebay header 352 may include a fusebay page length storage portion 358 configured to store a page length Lpg of fusebay 350 and from which page length storage register 318 may receive the fusebay page length Lpg. Fusebay 350 may include storage elements arranged in a predefined number of pages 360 each of a predefined page length, as represented by pages between first page 362 and last page 364. The vertical ellipsis above last page 364 indicates that as many pages may be included between first page 362 and last page 364 as may be desired and/or appropriate.

Fusebay storage element usage determining structure 300 may be construed as a fusebay storage element usage determining system when connected to a storage device 350, such as a fusebay, and to a repair register 332 and/or other devices involved in the control and/or processing of data handled by fusebay storage element usage determining structure 300. Additionally, while fusebay storage element usage determining structure 300 has been described as a circuit, other implementations are within the scope of embodiments.

Figure 4:
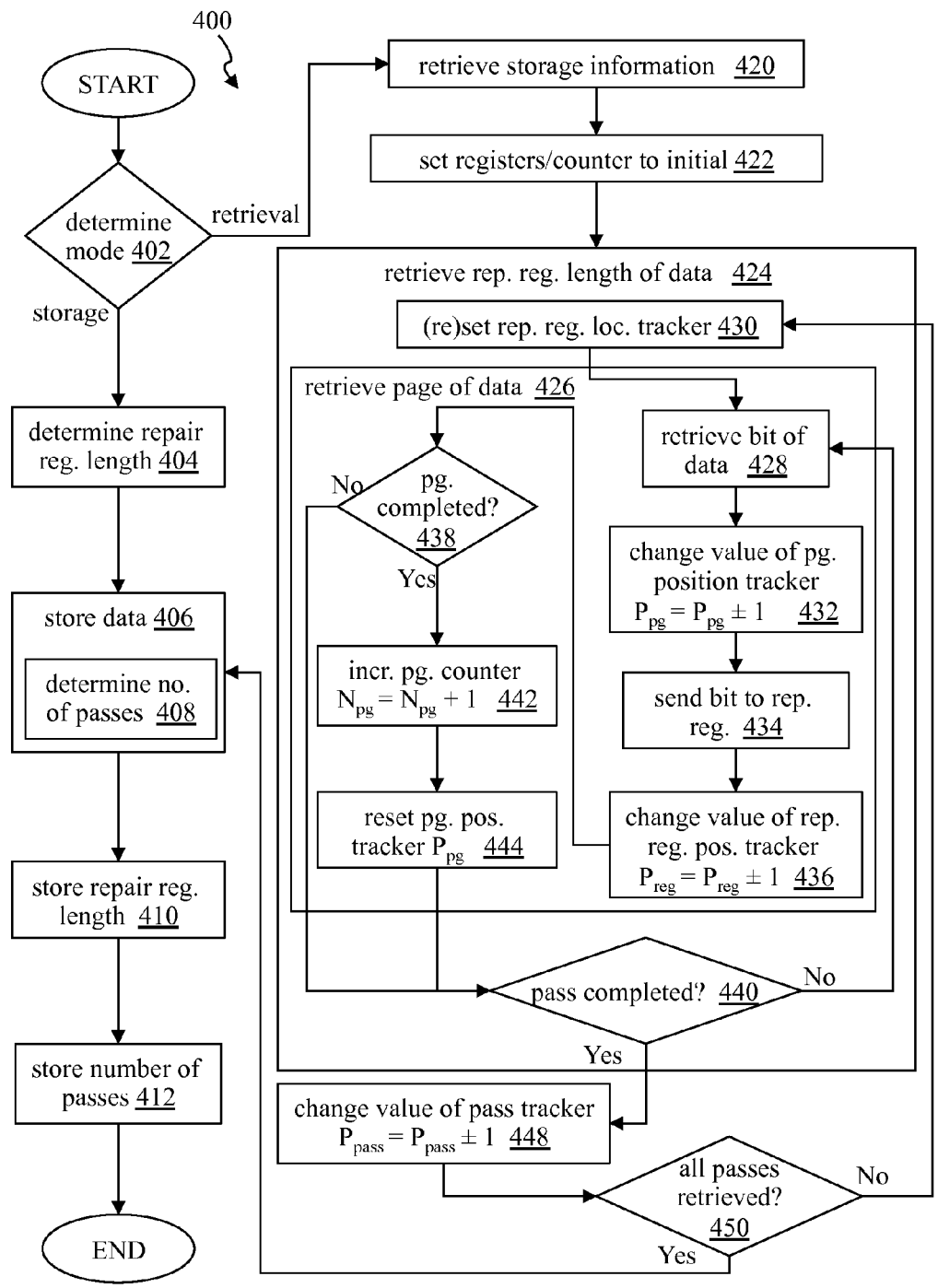
FIG. 4 is a schematic flow diagram of a fusebay storage element usage determining method according to an embodiment of the invention disclosed herein.

With reference to FIG. 4, a fusebay storage element usage determining method 400 includes determining a mode in which to operate (decision block 402). If the mode is programming or storage mode, then a length of repair register 332 may be determined (block 404). Data may be stored (block 406), during which storage a number of passes of repair register 332 is determined, such as by using a counter and/or by using repair pass position tracker 308 and/or pass completion detector 310. The repair register length may be stored (block 410), such as by storing the length in repair length storage portion 354 of fuse header 352 in fusebay 350. Similarly, a number of repair passes through repair register 332 may be stored (block 412), such as by storing the number of repair passes as determined, for example, by repair pass tracker 314, in pass count storage portion 356 of fuse header 352 in fusebay 350.

If it is determined that the operating mode is retrieval mode (decision block 402), then storage information may be retrieved (block 420), such as repair register length $L_{reg}$, fusebay page length $L_{pg}$, number of previously stored repair passes $N_{pass}$, and/or other information as may be appropriate and/or desired. Trackers and/or counters and/or registers may be set to initial values (block 422), which may include setting repair register position tracker $P_{reg}$, 308 to a first initial value, repair pass tracker $P_{pass}$, 314 to a second initial value, page position tracker $P_{pg}$, 320, to a third initial value, page counter $N_{pg}$, 324, and/or other registers and/or counters to additional initial values as may be appropriate and/or desired, though the particular point at which a respective initial value is set may vary in embodiments as will be explained below.

Retrieval of data may begin, such as by retrieving a repair register length of data (block 424) and/or retrieving a page of data (block 426) a bit of data at a time (block 428). Repair register position tracker 308, represented by $P_{reg}$, may be set to the first initial value (block 430), which in embodiments may be zero, while in other embodiments may be repair register length $L_{reg}$. After a bit of data is retrieved (block 430), a value of page position tracker $P_{pg}$ may be changed in value by one (block 432), the retrieved bit may be sent to the repair register (block 434), and a value of repair register position tracker $P_{reg}$ may be changed in value by one (block 436). It may be determined whether a page has been completed, such as by determining whether a page end has been reached (decision block 438). If a page end has not been reached, it may be determined whether a repair pass has been completed (decision block 440), such as by checking to see whether repair register length $L_{reg}$ has been reached. If in decision block 438 it is determined that a page end has been reached, then page counter $N_{pg}$, 324 may be advanced (block 442), page position tracker $P_{pg}$, 320 may be reset to the third initial value (block 444), and the check for repair register length having been reached may proceed (decision block 440).

If a repair pass has not been completed (decision block 440), then blocks 428-440 may be repeated for another bit of retrieved data. If a repair pass has been reached (decision block 440), then repair pass tracker $P_{reg}$, 310 may be changed in value by one (block 448) and it maybe determined whether all stored repair passes have been retrieved (decision block 450). If it is determined that all passes have not been retrieved (decision block 450), then retrieval of a next pass may begin (block 424), including resetting repair register position tracker $P_{reg}$, 308 (block 430). If it is determined that all passes have been retrieved (decision block 450), then the retrieval portion of method 400 may end, such as by reporting values of counters and/or by starting storage of additional data (block 406).

Figure 5:
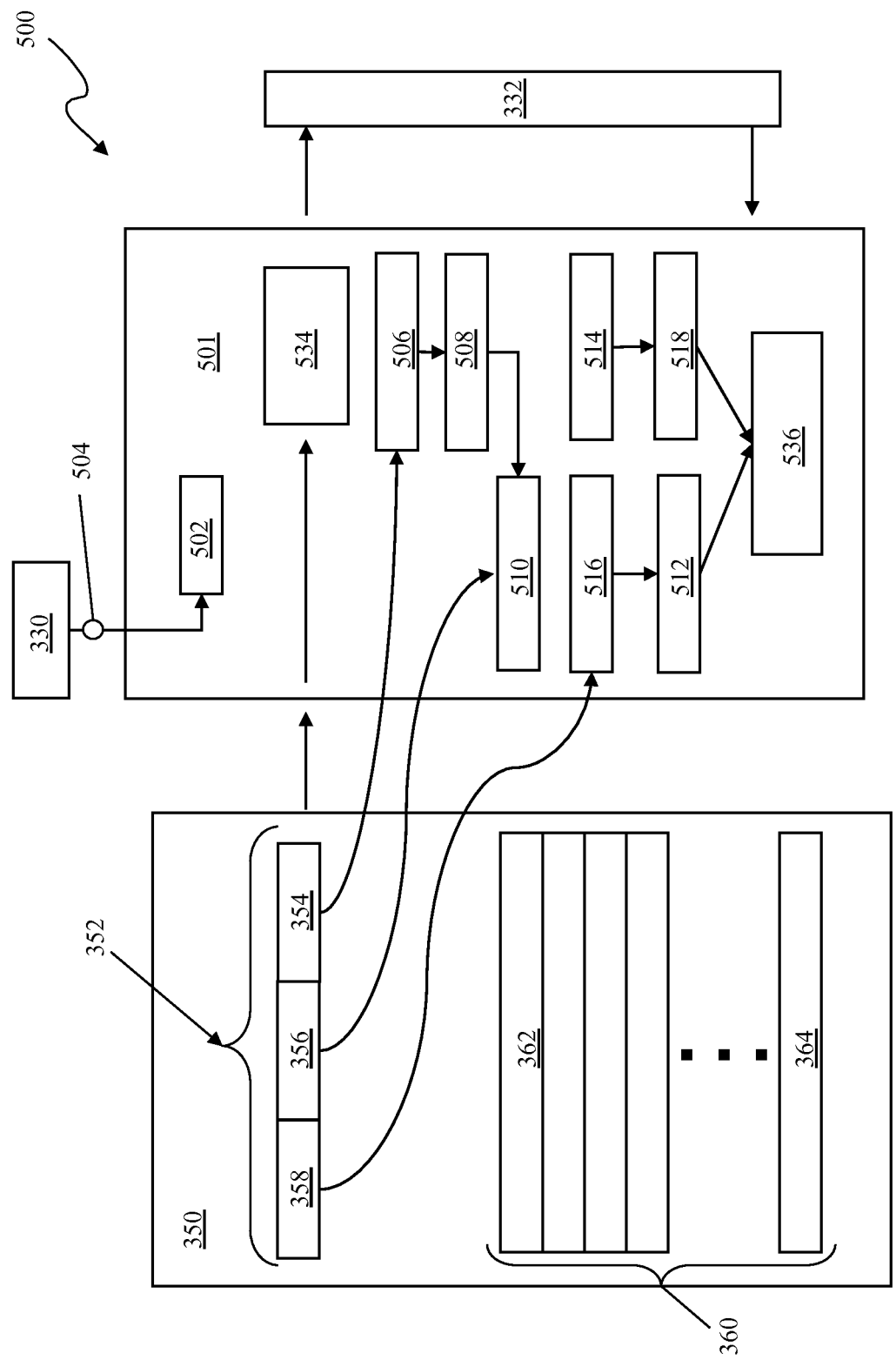
FIG. 5 is a schematic diagram of a fusebay controller including fusebay storage element usage determining components according to an embodiment of the invention disclosed herein.

In embodiments, repair register position tracker $P_{reg}$, page position tracker $P_{pg}$, and/or repair pass tracker $P_{pass}$, may take the form of decrement registers. However, to determine page position for use in addressing during storage, a decrement register alone may not be desirable. Instead, a value of page position tracker $P_{pg}$ may be subtracted from page length $L_{pg}$ to determine page position for use in addressing, an additional counter may be provided, or another solution may be employed as desired and/or appropriate. An example seen in FIG. 5 shows how embodiments of the invention disclosed herein may employ decrement registers. A fusebay storage usage determining structure 500 may, for example, be implemented in a fusebay controller structure 501 similar to the example shown in FIG. 3, and may be configured to be connected to fusebay 350. Structure 500 may include an instruction register 502 configured to receive an instruction signal via an instruction input 504, such as retrieval instructions, decompression instructions, storage instructions, compression instructions, register length calculation instructions, and other instructions as may be appropriate and/or desired.

A repair register length storage register 506 may be configured to receive a value of a length of a repair register 332, such as from repair register length storage portion 354. A repair register position decrement register 508 may be configured to receive the value received by repair length storage register 506 as an initial value, though embodiments may simply load the page length directly to repair register decrement register 508. Similarly, a repair pass decrement register 510 may be configured to receive a value of a number of previously stored repair passes of data as an initial value, such as by loading a number of previously stored repair passes from repair pass count storage portion 356.

In addition, a page counter 512 may be configured to be incremented when a page has been traversed, and a bit counter 514 may be configured to be incremented or advanced each time a bit of data is retrieved. Page counter 512 may be responsive to a page position decrement register 516 that may receive the fusebay page length, such as from page length storage portion 358 of fuse header 352. Additionally, a value of bit counter 514 may be used to track page position, such as by copying a value of bit counter 514 into a page position register 518, or the like, though page position register 518 may be a counter, which may allow bit counter 514 to be eliminated. Embodiments may be configured to interact with other logic elements of fusebay controller structure 501, such as decompression logic 534 and compression and/or fuseblow logic 536.

As with the example shown in FIG. 3, fusebay storage element usage determining structure 500 may be construed as a fusebay storage element usage determining system when connected to storage device 350, such as a fusebay, and to a repair register 332 and/or other devices involved in the control and/or processing of data handled by fusebay storage element usage determining structure 500. Additionally, while fusebay storage element usage determining structure 500 has been described as a circuit, other implementations are within the scope of embodiments.

Figure 6:
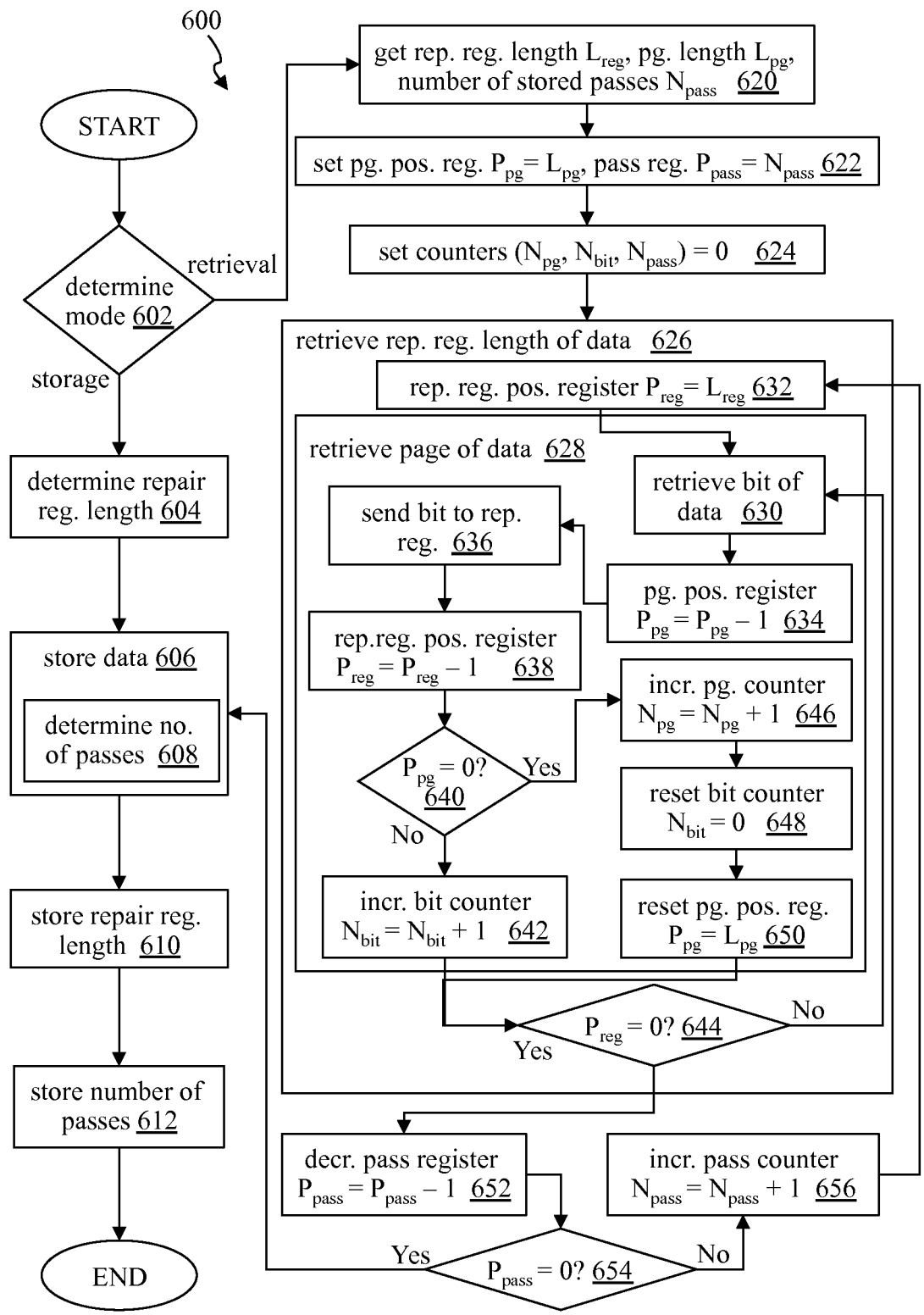
FIG. 6 is a schematic flow diagram of a fusebay storage element usage determining method according to an embodiment of the invention disclosed herein.

FIG. 6 shows an example of an embodiment of a storage usage determination method 600 usable with embodiments employing decrement registers, such as that shown in FIG. 5. Method 600 may have a storage mode like that of method 400, so that blocks 602-612 may be the same as blocks 402-412 of method 400. Similar to method 400, retrieval portion of method 600 may include retrieving storage information (block 620), such as repair register length, fusebay page length, a number of repair passes already stored in the fusebay, and/or other information as may be appropriate and/or desired. Decrement registers may be set to initial values (block 622), and counters may be initialized (block 624). For example, repair pass decrement register 510, represented by $P_{pass}$, may be set to the retrieved number of previously stored repair passes, page length register $P_{pg}$ may be set to fusebay page length $L_{pg}$, and/or other registers may be initialized. Counters that may be initialized may include page counter 512, bit position counter 514, a page counter, and/or other counters as may be appropriate and/or desired.

With initial values set, retrieval of data may begin, such as by retrieving a repair register length of data (block 626) and/or retrieving a page of data (block 628) a bit of data at a time (block 630). Repair register length decrement register 508, represented by $P_{reg}$, may be set to the retrieved repair register length $L_{reg}$ as an initial value (block 632). After a bit of data is retrieved (block 630), $P_{pg}$ may be decremented (block 634), the retrieved bit may be sent to repair register 332 (block 636), and $P_{reg}$ may be decremented (block 638). It may be determined whether a page end has been reached (decision block 640), such as by checking to see whether $P_{pg}$ has a zero value. If a page end has not been reached, bit position counter 514 may be advanced (block 642) and it may be determined whether a repair pass has been completed (decision block 644), such as by checking whether $P_{reg}$ has a zero value. If it is determined that a page end has been reached (decision block 640), then page counter 512 may be advanced (block 646), bit position counter 514 may be reset to zero (block 648), the page position register may be reset to fusebay page length (block 650), and the check for repair register length having been reached may proceed (decision block 644).

If the repair register length has not been reached (decision block 644), then blocks 630-644/650 may be repeated for another bit of retrieved data. If the repair register length has been reached (decision block 644), then repair pass decrement register 510 may be decremented (block 652) and it maybe determined whether all previously stored passes have been retrieved (decision block 654), such as by checking to see whether $P_{pass}$ has a zero value. If it is determined that passes remain to be retrieved (decision block 654), then a pass counter may be advanced (block 656) and retrieval of a next pass may begin (block 626, block 632). If it is determined that the all passes have been retrieved (decision block 654), then the method may end, such as by reporting values of counters and/or by starting storage of additional data (block 606).

In embodiments of the invention disclosed herein, repair register position tracker $P_{reg}$, page position tracker $P_{pg}$, and/or repair pass tracker $P_{pass}$, may take the form of increment registers or counters. An advantage of this implementation is that the position trackers also provide bit location information suitable for addressing, and the repair pass tracker may track passes added without requiring a reset or an additional counter. However, to detect completion of a repair pass, completion of a page of data, and retrieval of all previously stored repair passes, comparators may be needed, or another solution may be employed as desired and/or appropriate.

Figure 7:
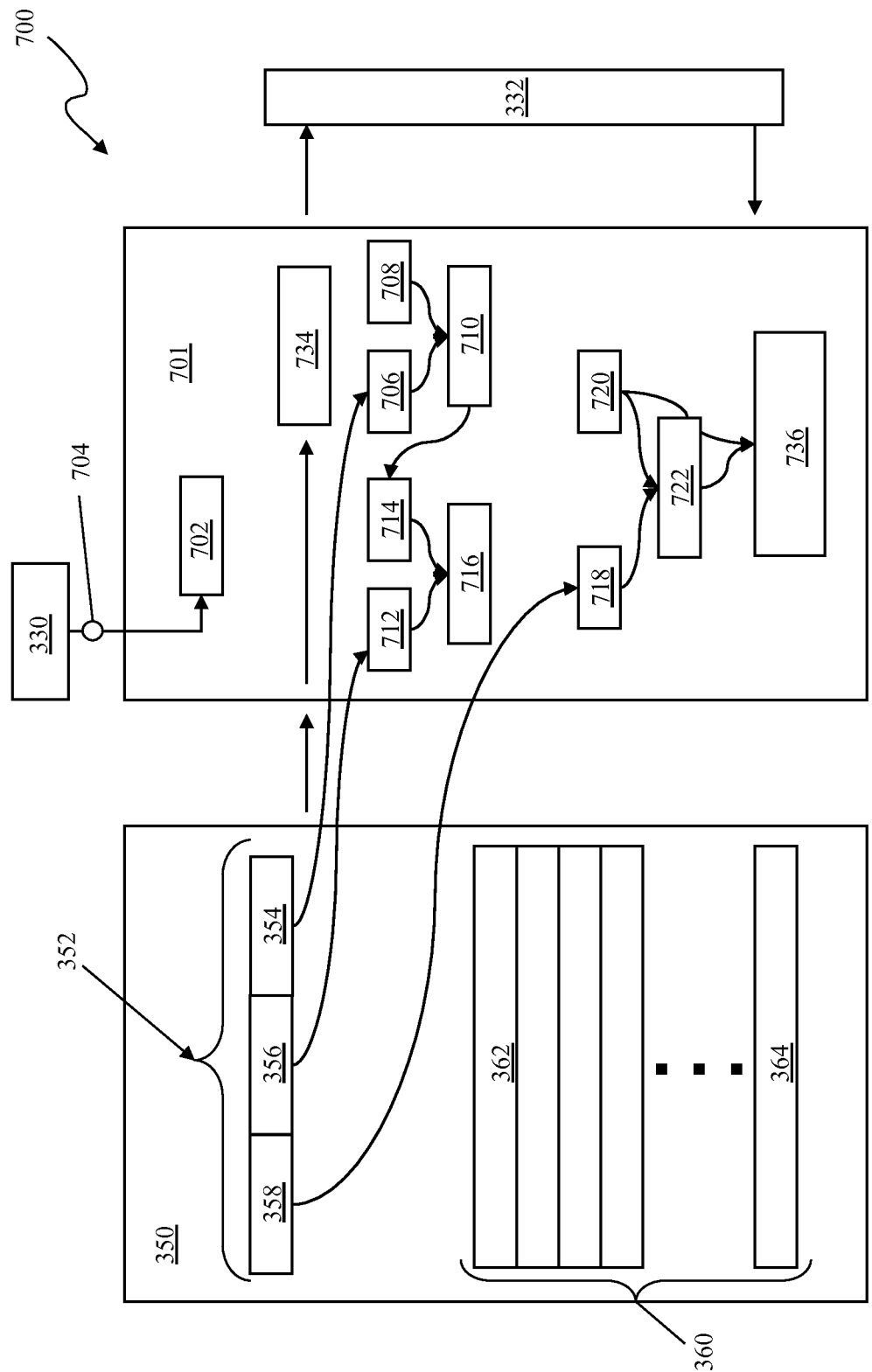
FIG. 7 is a schematic diagram of a fusebay controller including fusebay storage element usage determining components according to an embodiment of the invention disclosed herein.

An example seen in FIG. 7 shows how embodiments of the invention disclosed herein may employ increment registers or counters. A fusebay storage usage determining structure 700 may, for example, be implemented in a fusebay controller structure 701 similar to the example shown in FIG. 3, and may be configured to be connected to fusebay 350. Structure 700 may include an instruction register 702 configured to receive an instruction signal via an instruction input 704, such as retrieval instructions, decompression instructions, storage instructions, compression instructions, register length calculation instructions, and/or other instructions as may be appropriate and/or desired. A repair register length storage register 706 may be configured to receive repair register length, and a repair register position register 708 may be configured to provide an indication of how far into repair register 332 retrieved data has proceeded by increasing in value by one every time a retrieved bit of data is sent to repair register 332. A repair pass completion detector 710, such as a comparator configured to compare repair register page length from register 706 to repair register position from register 708. A repair pass storage register 712 may receive a number of previously stored repair passes $N_{pass}$, such as from pass count storage portion 356. A repair pass register 714 may be configured to be incremented each time a repair pass has been completed, during retrieval of previously stored data and/or storage of new data, as determined by repair pass completion detector 710. Structure 701 may further include an all passes completed detector 716, such as a comparator configured to receive a number of previously stored repair passes from register 712 or pass count storage portion 356, and a number of completed repair passes from register 714, which may determine when all previously stored repair passes of data have been retrieved.

Embodiments of the invention disclosed herein may also include a page length storage register 718 that may receive a page length $L_{pg}$ of and/or from fusebay 350. A page position tracker 720 may be configured to increase in value by one each time a bit is retrieved from fusebay 350 so that a position of a last retrieved bit may be determined. By comparing page length from register 718 with page position from 720, such as by using a page completion detector 722 in the form of a comparator, retrieval of a complete page of data from fusebay 350 may be detected. A page counter 324 responsive to detector/comparator 722 may be included to keep track of a number of pages of previously stored data that have been retrieved and/or new data that has been stored in fusebay 350. Embodiments may be configured to interact with other logic elements of fusebay controller structure 701, such as decompression logic 734 and compression and/or fuseblow logic 736. During storage of new data, for example, a value of page position tracker 720 and/or of page counter 722 may be supplied to fuseblow logic 736.

As with the examples of FIGS. 3 and 5, fusebay storage element usage determining structure 700 may be construed as a fusebay storage element usage determining system when connected to a storage device 350, such as a fusebay, and to a repair register 332 and/or other devices involved in the control and/or processing of data handled by fusebay storage element usage determining structure 700. Additionally, while fusebay storage element usage determining structure 700 has been described as a circuit, other implementations are within the scope of embodiments.

Figure 8:
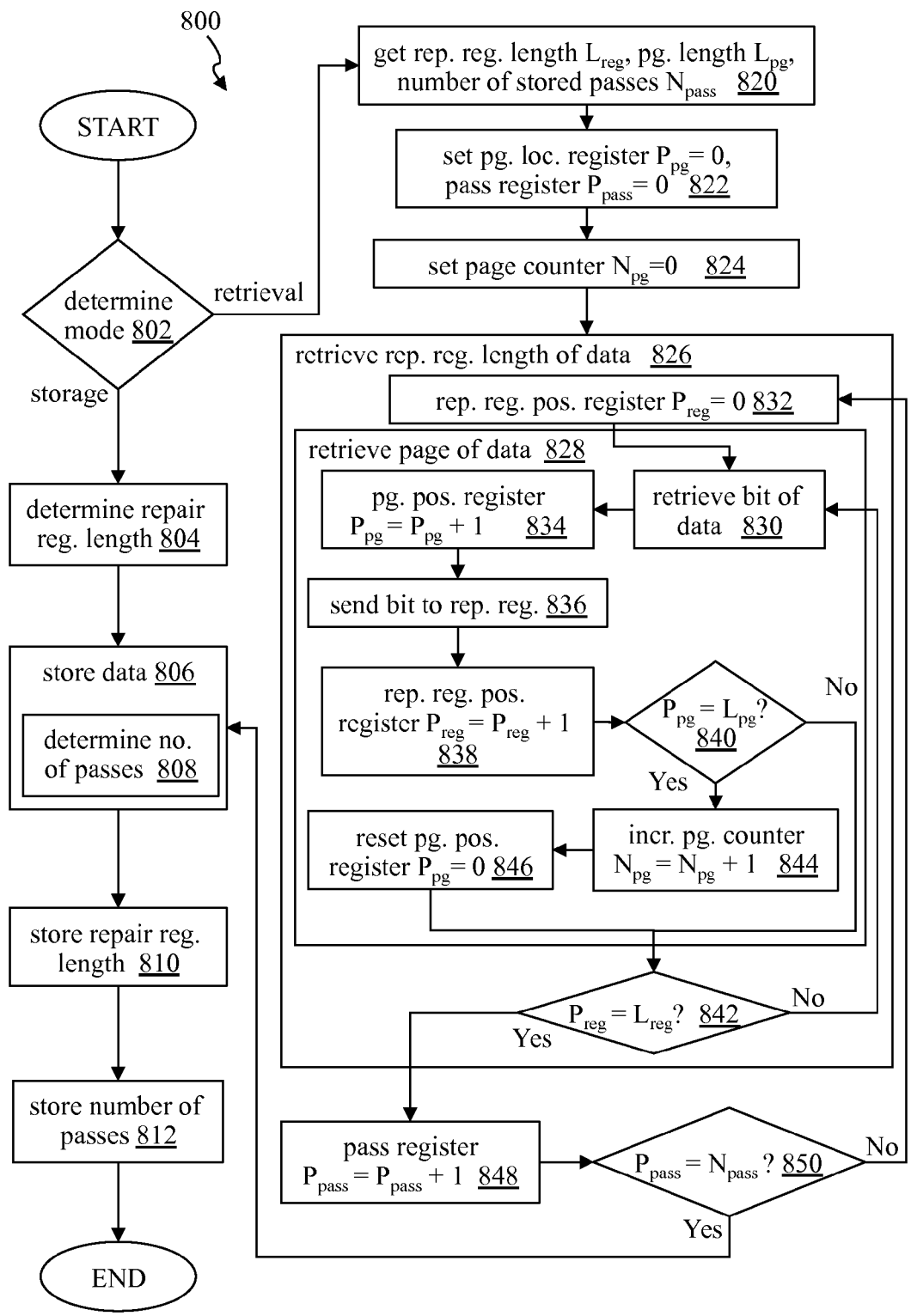
FIG. 8 is a schematic flow diagram of a fusebay storage element usage determining method according to an embodiment of the invention disclosed herein.

With reference to FIG. 8, a storage usage determining method 800 may have a storage mode like that of method 400, so that blocks 802-812 may be the same as blocks 402-412 of method 400. Similar to method 400, retrieval portion of method 800 may include retrieving storage information (block 820), such as repair register length, fusebay page length, a number of repair passes already stored in the fusebay, and/or other information as may be appropriate and/or desired. Trackers and/or counters and/or registers may be set to initial values (block 822), which may include setting repair register position tracker $P_{reg}$ and repair pass register $P_{pass}$ to zero. In addition, counters, such as page counter $N_{pg}$ and/or other counters may be set to zero (block 824). In both block 822 and block 824, additional initial values may be employed as may be appropriate and/or desired, and the particular point at which a respective initial value is set may vary in embodiments as will be explained below.

Retrieval of data may begin, such as by retrieving a repair register length of data (block 826) and/or retrieving a page of data (block 828) a bit of data at a time (block 830). Repair register position register 708, represented by $P_{reg}$, may be set to the first initial value (block 832), which in embodiments may be zero, while in other embodiments may be repair register length $L_{reg}$. After a bit of data is retrieved (block 830), a value of page position register $P_{pg}$ may be increased by one (block 834), the retrieved bit may be sent to the repair register (block 836), and a value of repair register position tracker $P_{reg}$ may be increased by one (block 838). It may be determined whether a page has been completed, such as by determining whether page position is equal to the fusebay page length (decision block 840). If a page has not been completed, it may be determined whether a repair pass has been completed (decision block 842), such as by checking to see whether repair register position is equal to repair register length $L_{reg}$. If in decision block 840 it is determined that a page end has been reached, then page counter $N_{pg}$, 722 may be advanced (block 844), page position tracker $P_{pg}$, 720 may be reset to zero (block 846), and the check for a repair register having been completed may proceed (decision block 842).

If a repair pass has not been completed (decision block 842), then blocks 828-842/846 may be repeated for another bit of retrieved data. If a repair pass has been completed (decision block 842), then repair pass register $P_{reg}$, 714 may be increased in value by one (block 848) and it maybe determined whether all stored repair passes have been retrieved (decision block 850). If it is determined that all passes have not been retrieved (decision block 850), then retrieval of a next pass may begin (block 826), including resetting repair register position register $P_{reg}$, 708 (block 832). If it is determined that all passes have been retrieved (decision block 850), then the retrieval portion of method 800 may end, such as by reporting values of counters and/or by starting storage of additional data (block 406).

Figure 9:
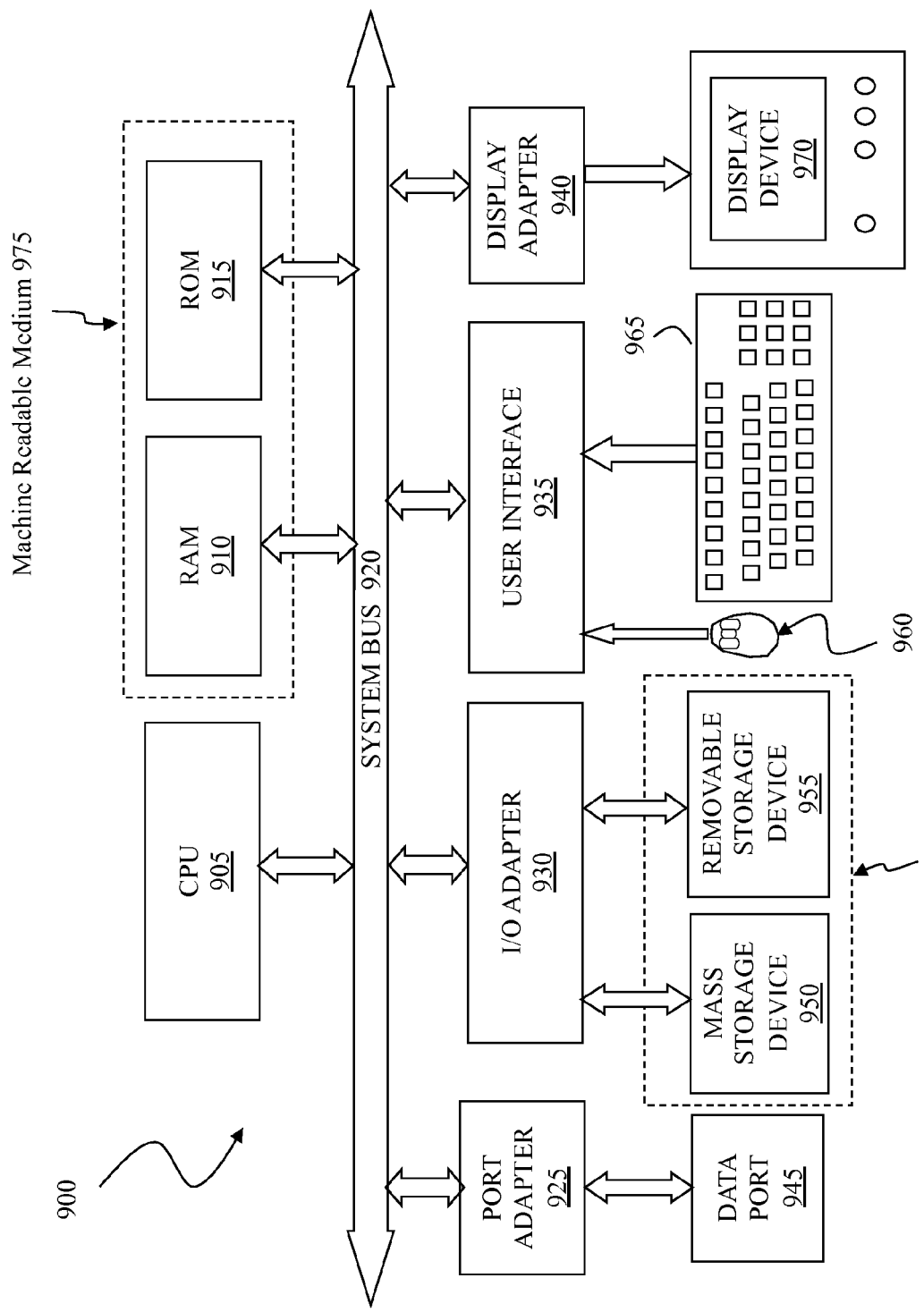
FIG. 9 is a block diagram of a general purpose computer system which may be used to practice the invention.

FIG. 9 illustrates a block diagram of a general-purpose computer system which can be used to implement the fusebay controller circuit and circuit design structure described herein. The design structure may be coded as a set of instructions on removable or hard media for use by general-purpose computer. FIG. 9 is a schematic block diagram of a general-purpose computer for practicing the present invention. FIG. 9 shows a computer system 900, which has at least one microprocessor or central processing unit (CPU) 905. CPU 905 is interconnected via a system bus 920 to machine readable media 975, which includes, for example, a random access memory (RAM) 910, a read-only memory (ROM) 915, a removable and/or program storage device 955 and a mass data and/or program storage device 950. An input/output (I/O) adapter 930 connects mass storage device 950 and removable storage device 955 to system bus 920. A user interface 935 connects a keyboard 965 and a mouse 960 to system bus 920, and a port adapter 925 connects a data port 945 to system bus 920 and a display adapter 940 connect a display device 970. ROM 915 contains the basic operating system for computer system 900. Examples of removable data and/or program storage device 955 include magnetic media such as floppy drives, tape drives, portable flash drives, zip drives, and optical media such as CD ROM or DVD drives. Examples of mass data and/or program storage device 950 include hard disk drives and non-volatile memory such as flash memory. In addition to keyboard 965 and mouse 960, other user input devices such as trackballs, writing tablets, pressure pads, microphones, light pens and position-sensing screen displays may be connected to user interface 935. Examples of display device 970 include cathode-ray tubes (CRT) and liquid crystal displays (LCD).

A machine readable computer program may be created by one of skill in the art and stored in computer system 900 or a data and/or any one or more of machine readable medium 975 to simplify the practicing of this invention. In operation, information for the computer program created to run the present invention is loaded on the appropriate removable data and/or program storage device 955, fed through data port 945 or entered using keyboard 965. A user controls the program by manipulating functions performed by the computer program and providing other data inputs via any of the above mentioned data input means. Display device 970 provides a means for the user to accurately control the computer program and perform the desired tasks described herein.

Figure 10:
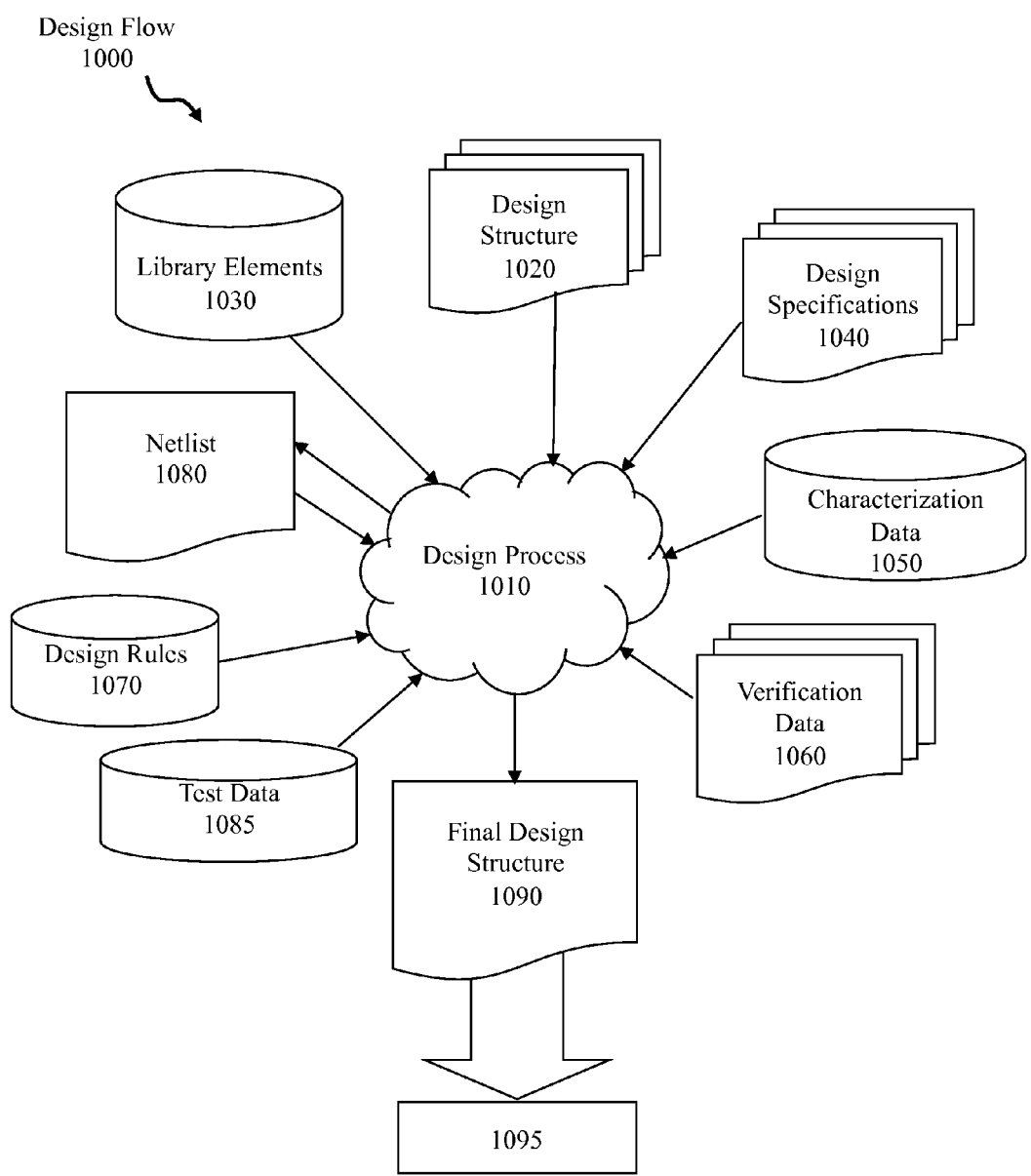
FIG. 10 is a flow diagram of a design process used in semiconductor design, manufacturing, and/or test.

FIG. 10 shows a block diagram of an example design flow 1000. Design flow 1000 may vary depending on the type of IC being designed. For example, a design flow 1000 for building an application specific IC (ASIC) may differ from a design flow 1000 for designing a standard component. Design structure 1020 is preferably an input to a design process 1010 and may come from an IP provider, a core developer, or other design company or may be generated by the operator of the design flow, or from other sources. Design structure 1020 comprises fusebay storage element usage determining circuit or structure 300 in the form of schematics or HDL, a hardware-description language (e.g., Verilog, VHDL, C, etc.). Design structure 1020 may be contained on one or more machine readable medium. For example, design structure 1020 may be a text file or a graphical representation of fusebay storage element usage determining circuit or structure 300. Design process 1010 preferably synthesizes (or translates) fusebay storage element usage determining circuit or structure 300 into a netlist 1080, where netlist 1080 is, for example, a list of wires, transistors, logic gates, control circuits, 110, models, etc., that describes the connections to other elements and circuits in an integrated circuit design and recorded on at least one of machine readable medium. This may be an iterative process in which netlist 1080 is resynthesized one or more times depending on design specifications and parameters for the circuit.

Design process 1010 may include using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 40 nm, etc.), design specifications 1040, characterization data 1050, verification data 1060, design rules 1070, and test data files 1085 (which may include test patterns and other testing information). Design process 1010 may further include, for example, standard circuit design processes such as timing analysis, verification, design rule checking, place and route operations, etc. One of ordinary skill in the art of integrated circuit design can appreciate the extent of possible electronic design automation tools and applications used in design process 1010 without deviating from the scope and spirit of the invention. The design structure of the invention is not limited to any specific design flow.

Ultimately, design process 1010 preferably translates fusebay storage element usage determining circuit or structure 300, along with the rest of the integrated circuit design (if applicable), into a final design structure 1090 (e.g., information stored in a GDS storage medium). Final design structure 1090 may comprise information such as, for example, test data files, design content files, manufacturing data, layout parameters, wires, levels of metal, vias, shapes, test data, data for routing through the manufacturing line, and any other data required by a semiconductor manufacturer to produce fusebay storage element usage determining circuit or structure 300. Final design structure 1080 may then proceed to a stage 1085 where, for example, final design structure 1080 proceeds to tape-out, is released to manufacturing, is sent to another design house or is sent back to the customer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A fusebay storage element usage determining structure implemented in a fusebay controller structure configured to retrieve data from and to send data to a fusebay and to retrieve data from and to send data to a repair register, the fusebay storage element usage determining structure comprising:
    a repair position tracker configured to receive a first initial value, and to change in value by one in response to a bit of repair data being sent to the repair register;
    a pass tracker configured to receive a second initial value, and further configured to change in value by one in response to a repair pass of data being completed; and
    a page end indicator configured to receive a third initial value, to track a page location, and to indicate when an end of a page has been reached.

2. The structure of claim 1, wherein at least one of the repair location tracker, the pass tracker, or the page end indicator includes a decrement register and the respective first, second, or third initial value includes a respective one of a length of the repair register, a number of passes stored in the fusebay, or a page length of the fusebay.

3. The structure of claim 2, wherein the repair position tracker includes a decrement register and a repair pass is completed when the repair position decrement register reaches a value of zero.

4. The structure of claim 2, wherein the pass tracker includes a decrement register and all repair passes are completed when the pass decrement register reaches a value of zero.

5. The structure of claim 2, further comprising a page counter, the third initial value is a page length of the fusebay, and wherein the page end indicator includes:
    a decrement register that is a page position tracker configured to decrease in value in response to a bit of data being retrieved from the fusebay;
    a page position counter configured to increase in value by one from an initial value of zero for each retrieved bit of data, the page position tracker thereby tracking a page location; and
    the page end indicator further being configured to trigger an increase in value of the page counter by one when the page position tracker has a value of zero, the page end indicator thereby indicating that an end of a page has been reached.

6. The structure of claim 1, wherein at least one of the repair position tracker, the pass tracker, or the page end indicator includes a respective increment register and the respective first, second, or third initial value is zero, the structure further including a respective comparator that compares a respective value of a respective increment register to a respective one of a length of the repair register, a number of passes stored in the fusebay, or a page length of the fusebay.

7. The structure of claim 6, further comprising a page counter and wherein the page end indicator includes:
    an increment register that is a page position tracker configured to increase in value by one in response to a bit of data being retrieved from the fusebay, the page position tracker thereby tracking a page location;
    a comparator that is a page length comparator configured to compare the page location register with the page length of the fusebay; and
    the page end indicator further being configured to trigger an increase in value of the page counter by one when the page length comparator determines that a value of the page position tracker is equal to the page length of the fuse bay, the page end indicator thereby indicating that an end of a page has been reached.

8. The structure of claim 1, wherein the structure is configured to receive at least one of the first initial value, the second initial value, or the third initial value from a fuse header of the fusebay.

9. A fusebay storage element usage determining system comprising:
    a fusebay including a fuse header, the fuse header having a repair register length storage portion and a pass count storage portion;
    a fusebay controller configured to communicate with a repair register and with the fusebay;
    a repair position tracker configured to receive a first initial value, and to change in value by one in response to a bit of repair data being sent to the repair register;
    a pass tracker configured to receive a second initial value, and to change in value by one in response to a repair pass being complete; and
    a page end indicator configured to receive a third initial value, to track a page location, and to indicate when an end of a page has been reached.

10. The structure of claim 9, wherein at least one of the repair position tracker, the pass tracker, or the page end indicator includes a decrement register and the respective first, second, or third initial value includes a respective one of a length of the repair register, a number of passes stored in the fusebay, or a page length of the fusebay.

11. The structure of claim 10, wherein the repair position tracker includes a decrement register and a repair pass is completed when the repair position tracker reaches a value of zero.

12. The structure of claim 10, wherein the pass tracker includes a decrement register and repair pass is completed when the pass tracker reaches a value of zero.

13. The structure of claim 10, further comprising a page counter and wherein the page end indicator includes:
   a decrement register that is a page position tracker configured to decrease in value in response to a bit of data being retrieved from the fusebay;
   a page position counter configured to increase in value by one for each retrieved bit of data, the page position counter thereby tracking a page location; and
   the page end indicator further being configured to trigger an increase in value of the page counter by one when the page position tracker has a value of zero, the page end indicator thereby indicating that an end of a page has been reached.

14. The structure of claim 9, wherein at least one of the repair position tracker, the pass tracker, or the page end indicator includes a respective increment register and the respective first, second, or third initial value is zero, the structure further including a respective comparator that compares a respective value of a respective increment register to a respective one of a length of the repair register, a number of passes stored in the fusebay, or a page length of the fusebay.

15. The structure of claim 14, further comprising a page counter and wherein the page end indicator includes:
   an increment register that is a page position tracker configured to increase in value by one in response to a bit of data being retrieved from the fusebay, the page position tracker thereby tracking a page location;
   a comparator that is a page length comparator configured to compare a value of the page position tracker with the page length of the fusebay; and
   the page end indicator further being configured to trigger an increase in value of the page counter by one when the page length comparator determines that the page position tracker is equal to the page length of the fuse bay, the page end indicator thereby indicating that an end of a page has been reached.

16. The structure of claim 1, wherein the structure is configured to receive at least one of the first initial value, the second initial value, or the third initial value from a fuse header of the fusebay.

17. A fusebay storage element usage determining method executed by a fusebay storage element usage determining structure configured to communicate with a fusebay and including a repair register position tracker, a pass tracker, a page position tracker, and a page end indicator, the method comprising:
   setting a first initial value of the repair position tracker;
   setting a second initial value of the pass tracker;
   setting a third initial value of the page position tracker;
   retrieving a bit of data from the fusebay;
   changing by one the value of the page position tracker;
   sending a bit of repair data to the repair register;
   changing by one a value of the repair register position tracker;
   determining whether the retrieved bit is a last bit stored in the fusebay;
   determining, using at least a value of the repair register position tracker, whether a repair pass of data has been completed;
   responsive to a repair pass of data having been completed:
      changing by one the value of the pass tracker;
      determining, using at least a value of the pass tracker, whether all stored repair passes of data have been retrieved;
         responsive to all stored repair passes of data having been retrieved and the retrieved bit being the last bit of data stored in the fusebay, reporting a position of the last bit; and
         responsive to all repair passes not having been retrieved and the retrieved bit of data not being the last bit of data stored in the fusebay, repeating the setting of the repair position tracker to the first initial value, the retrieving of a bit of data from the fusebay, the changing by one of the value of the page position tracker, the sending of a bit of repair data to the repair register, the changing by one of the value of the repair register position tracker, and the determining of whether a repair pass of data has been completed;
   responsive to a repair pass not having been completed and the retrieved bit of data not being the last bit of data stored in the fusebay, repeating the retrieving of a bit of data from the fusebay, changing by one the value of the page position tracker, the sending of a bit of repair data to the repair register, the changing by one of the value of the repair position tracker, and the determining of whether a repair pass of data has been completed; and
   responsive to the retrieved bit of data being the last bit of data stored in the fusebay, ending retrieval of data from the fusebay and reporting a location of the last bit.

18. The method of claim 17, wherein the page end indicator includes a decrement register that is a page position tracker, and a page position counter initially set to zero, the method further comprising:
   decrementing the page position tracker;
   determining whether the page position tracker has a value of zero;
   advancing the page position counter responsive to the page position tracker having a value other than zero; and
   responsive to the page position tracker having a value of zero, resetting the page position counter to zero, incrementing the page counter, and resetting the page position tracker to the third initial value.

19. The method of claim 17, wherein the method further comprises storing new data, including tracking new repair passes of data added to the fusebay and storing in the fusebay a value of the sum of stored repair passes and newly stored repair passes.

20. The method of claim 17, wherein the fusebay storage element usage determining structure further comprises a fuse header in the fusebay, the fuse header including at least one of a repair register length storage portion, a previous pass count storage portion, or a page length storage portion, and the method further comprises retrieving at least one of the first initial value, the second initial value, or the third initial value from the respective repair register length storage portion, previous pass count storage portion, or the page length storage portion.

* * * * *